United States Patent
Golanski et al.

(10) Patent No.: US 9,786,755 B2
(45) Date of Patent: Oct. 10, 2017

(54) PROCESS FOR PRODUCING, FROM AN SOI AND IN PARTICULAR AN FDSOI TYPE SUBSTRATE, TRANSISTORS HAVING GATE OXIDES OF DIFFERENT THICKNESSES, AND CORRESPONDING INTEGRATED CIRCUIT

(71) Applicant: STMicroelectronics (Crolles 2) SAS, Crolles (FR)

(72) Inventors: Dominique Golanski, Gieres (FR); Gregory Bidal, Grenoble (FR); Simon Jeannot, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 14/930,150

(22) Filed: Nov. 2, 2015

(65) Prior Publication Data

US 2016/0276451 A1 Sep. 22, 2016

(30) Foreign Application Priority Data

Mar. 18, 2015 (FR) ..................... 15 52244

(51) Int. Cl.
*H01L 21/84* (2006.01)
*H01L 29/423* (2006.01)
(Continued)

(52) U.S. Cl.
CPC ........ *H01L 29/42364* (2013.01); *H01L 27/12* (2013.01); *H01L 27/1207* (2013.01);
(Continued)

(58) Field of Classification Search
CPC . H01L 27/12; H01L 27/1207; H01L 29/0649; H01L 29/7881; H01L 29/2364;
(Continued)

(56) References Cited

U.S. PATENT DOCUMENTS 6,222,234 B1 4/2001 Imai
7,666,735 B1 2/2010 Brown et al.
(Continued)

FOREIGN PATENT DOCUMENTS

| EP | 2381470 A1 | 10/2011 |
|---|---|---|
| EP | 2500933 A1 | 9/2012 |
| FR | 2816108 A1 | 5/2002 |

OTHER PUBLICATIONS

Ramey, Steve: "Tri-Gate Reliability," Intel, 2013 (76 pages).
INPI Search Report and Written Opinion for FR 1552244 dated Jan. 11, 2016 (7 pages).

*Primary Examiner* — Vongsavanh Sengdara
(74) *Attorney, Agent, or Firm* — Gardere Wynne Sewell LLP

(57) ABSTRACT

An integrated circuit includes a first zone for a first transistor and a second zone for a second transistor. The transistors are supported by a substrate of the silicon-on-insulator type that includes a semiconductor film on a buried insulating layer on a carrier substrate. In the second zone, the semiconductor film has been removed. The second transistor in the second zone includes a gate-dielectric region resting on the carrier substrate that is formed by a portion of the buried insulating layer). The first transistor in the first zone includes a gate-dielectric region formed by a dielectric layer on the semiconductor film.

5 Claims, 3 Drawing Sheets

(51) Int. Cl.
    *H01L 27/12*     (2006.01)
    *H01L 29/06*     (2006.01)
    *H01L 29/08*     (2006.01)
    *H01L 29/66*     (2006.01)
    *H01L 29/78*     (2006.01)
    *H01L 29/788*     (2006.01)

(52) U.S. Cl.
    CPC ...... *H01L 29/0649* (2013.01); *H01L 29/0847* (2013.01); *H01L 29/66545* (2013.01); *H01L 29/7838* (2013.01); *H01L 29/7881* (2013.01)

(58) Field of Classification Search
    CPC ........... H01L 29/66545; H01L 29/7838; H01L 29/0847
    USPC ........................................................ 438/152
    See application file for complete search history.

(56) References Cited

U.S. PATENT DOCUMENTS

| | | | |
|---|---|---|---|
| 2004/0180478 A1 | 9/2004 | Yang et al. | |
| 2008/0203477 A1 | 8/2008 | Yamazaki et al. | |
| 2009/0315099 A1* | 12/2009 | Park ................. | H01L 27/11526 257/324 |
| 2010/0035390 A1* | 2/2010 | Ding ............... | H01L 21/823462 438/152 |
| 2010/0109044 A1 | 5/2010 | Tekleab et al. | |
| 2010/0167482 A1* | 7/2010 | Mori ............... | H01L 21/823857 438/285 |
| 2014/0001554 A1* | 1/2014 | Adam ............ | H01L 21/823412 257/347 |
| 2014/0312404 A1 | 10/2014 | Chou et al. | |

\* cited by examiner

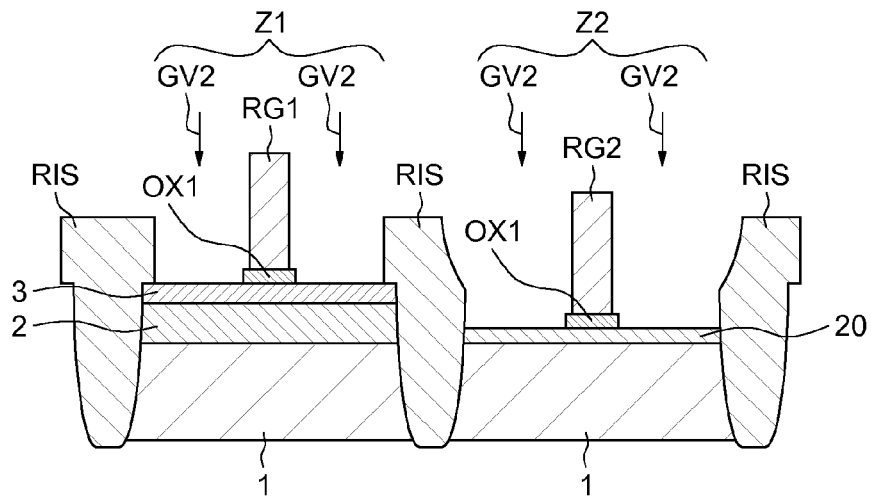
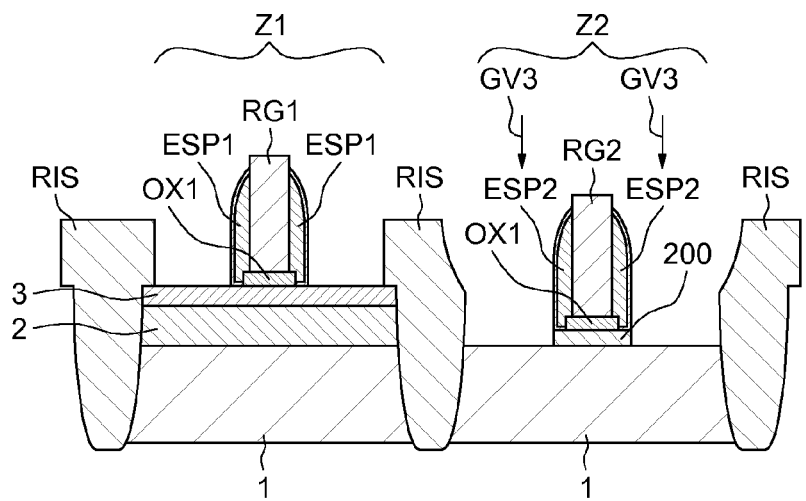
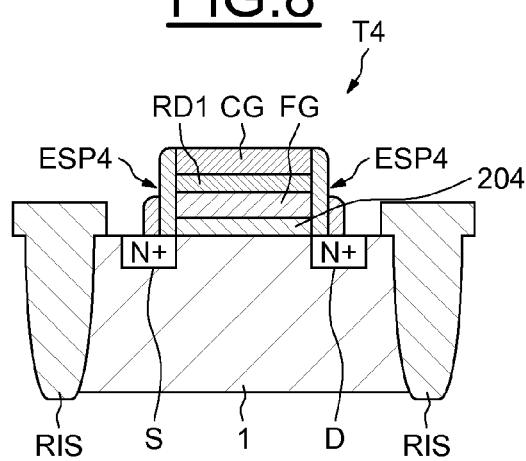

PROCESS FOR PRODUCING, FROM AN SOI AND IN PARTICULAR AN FDSOI TYPE SUBSTRATE, TRANSISTORS HAVING GATE OXIDES OF DIFFERENT THICKNESSES, AND CORRESPONDING INTEGRATED CIRCUIT

PRIORITY CLAIM

This application claims priority to French Application for Patent No. 1552244 filed Mar. 18, 2015, the disclosure of which is incorporated by reference.

TECHNICAL FIELD

The invention relates to integrated circuits, and more particularly to the production of transistors capable of holding high voltages, for example 3 to 5 volts or more, from a silicon-on-insulator (SOI) and more particularly a fully depleted silicon-on-insulator (FDSOI) type substrate, without these examples being limiting.

BACKGROUND

A silicon-on-insulator type substrate comprises a semiconductor film, for example made of silicon or a silicon alloy, for example a silicon-germanium alloy, located on a buried insulating layer, commonly designated by the acronym "BOX" (for Buried OXide), itself located on a carrier substrate, for example a semiconductor well.

In a fully-depleted SOI (FDSOI) technology, the semiconductor film is fully depleted, i.e. it is composed from an intrinsic semiconductor. Its thickness is generally about a few nanometers, for example 7 nanometers. Moreover, the buried insulating layer itself generally has a small thickness of about twenty nanometers.

On account of the small thickness of the semiconductor film, the source and drain regions of transistors comprise portions that are raised relative to the semiconductor film so as to ensure an adequate electrical connection between these regions and the channel region of the transistor.

Such raised source and drain regions (commonly designated in the art by the acronym "RSD": for Raised Source and Drain) are typically obtained by epitaxy.

Moreover, the production of transistors capable typically of withstanding high voltages of about a plurality of volts, such as for example extended drain MOS transistors (known in the art by the acronym "DRift MOS"), requires thick gate oxides to be formed.

However, this proves to be complicated to achieve on SOI and in particular FDSOI type substrates because of the small thickness of the semiconductor film.

Specifically, the semiconductor film will be partially consumed during the production of these thick oxides. Furthermore, since it is necessary to preserve the initial thickness of the semiconductor film (for example 7 nanometers), it is then necessary to start with a thicker semiconductor film the thickness of which must be adjusted to obtain in fine said initial thickness on account of the expected consumption of the semiconductor film.

SUMMARY

According to one method of implementation, it is proposed to produce transistors having thick gate oxides from a silicon-on-insulator type substrate without increasing the initial thickness of the semiconductor film.

Furthermore, in this regard, it is advantageously proposed to use at least one portion of the buried insulating layer (BOX) of the silicon-on-insulator type substrate to form at least one portion of a gate dielectric region of a transistor, for example an MOS transistor or indeed a transistor having a double gate (floating gate and control gate) such as the type of transistor incorporated in FLASH or EEPROM type memory cells.

According to one aspect an integrated circuit is provided comprising, in a first zone, a substrate of the silicon-on-insulator type comprising a semiconductor film located on a buried insulating layer itself located on a carrier substrate, and, in a second zone from which said semiconductor film has been removed, at least one transistor comprising a gate-dielectric region resting on the carrier substrate and comprising a portion of said buried insulating layer.

Thus, the use of one portion at least of the oxide of the buried insulating layer as a gate dielectric makes it possible to easily adjust the thickness of the gate-dielectric region so as to allow high-voltage transistors to be produced without consuming the semiconductor film in and on which other MOS transistors are optionally produced.

According to one embodiment, the integrated circuit furthermore comprises in said first zone at least one first transistor possessing a first gate-dielectric region resting on said semiconductor film and thinner than the gate-dielectric region of said at least one transistor located in said second zone.

The use of one portion at least of the oxide of the buried insulating layer as a gate dielectric makes it possible to easily adjust the thickness of the gate-dielectric region so as to allow transistors having gate oxides of different thicknesses to be produced.

Although it is possible in theory to use any thickness of the buried insulating layer as a gate oxide, the thickness of said portion of the buried layer is generally smaller than the thickness of the buried insulating layer of the silicon-on-insulator type substrate.

According to one embodiment, the first gate-dielectric region comprises at least one layer of a first dielectric material and the gate-dielectric region of said at least one transistor located in said second zone comprises at least one layer of said first dielectric material on said portion of the buried insulating layer.

The first dielectric material may comprise a material of high relative dielectric constant (a high K material) for example having a relative dielectric constant K higher than or equal to 15.

This dielectric may for example be chosen from the group formed by $HfO_2$, $ZrO_2$, $Al_2O_3$, $AlN$, $TiN$, $TiO_2$.

According to one embodiment, the integrated circuit may comprise, in said second zone, a plurality of transistors the gate-dielectric regions of which comprise respective portions of buried insulating layer having different thicknesses.

According to one embodiment, said at least one transistor located in said second zone is a double-gate transistor comprising a floating-gate first region resting on the carrier substrate by way of said at least one portion of said buried insulating layer and a control-gate second region resting on said floating-gate first region by way of another gate-dielectric region.

According to another aspect, a process is provided for fabricating at least one transistor within an integrated circuit, said integrated circuit comprising, in a first zone, a silicon-on-insulator type substrate comprising a semiconductor film on a buried insulating layer on a carrier substrate, in one zone of the integrated circuit, the process comprising, in a second zone of the integrated circuit, removing said semiconductor film and producing at least one transistor in and on the carrier substrate, the gate-dielectric region of said at least one transistor resting on said carrier substrate and comprising a portion of said buried insulating layer.

According to one method of implementation, the process furthermore comprises producing, in said first zone, at least one first transistor in and on the semiconductor film and possessing a first gate-dielectric region resting on said semiconductor film and thinner than the gate-dielectric region of said at least one transistor located in said second zone.

According to one method of implementation, the production of said transistors comprises: in said first zone, masking the silicon-on-insulator type substrate; in said second zone, etching the silicon-on-insulator type substrate so as to remove at least the semiconductor film and leave behind at least one portion of said buried insulating layer; forming, on the structure thus obtained, a multilayer comprising at least one layer of a dielectric material and at least one layer of a gate material; etching said multilayer so as to form, in said first zone, for said at least one first transistor, a first insulated gate region resting on said semiconductor film, and, in said second zone, for said at least one transistor, a second insulated gate region resting on said at least one portion of the buried insulating layer; forming first insulating lateral regions on the flanks of the first gate region; forming second insulating lateral regions on the flanks of the second gate region; and etching said at least one portion of the buried insulating layer located exterior to the second insulating lateral regions.

BRIEF DESCRIPTION OF THE DRAWINGS

Other advantages and features of the invention will become apparent on examining the detailed description of completely non-limiting methods of implementation and embodiments, and the appended drawings, in which:

FIGS. 1 to 8 schematically illustrate methods of implementation and embodiments of the invention.

DETAILED DESCRIPTION

Figure 1:
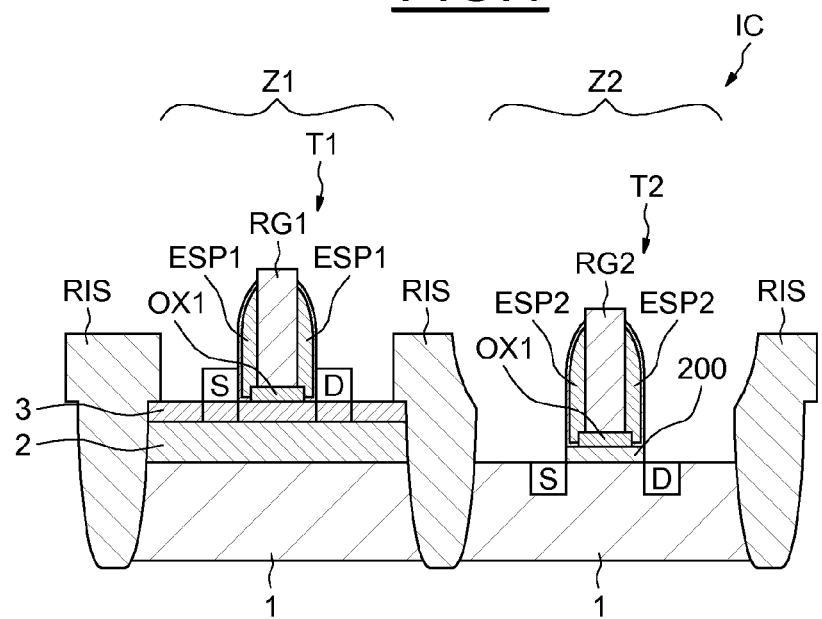

In FIG. 1, the reference IC designates an integrated circuit comprising, in a first zone Z1, a fully depleted silicon-on-insulator (FDSOI) substrate comprising a semiconductor film 3, for example having a thickness of 7 nanometers, on a buried insulating layer 2 (BOX), for example having a thickness of 25 nanometers, itself supported by a carrier substrate 1 that may for example be a semiconductor well.

A first MOS transistor T1 is produced in and on the semiconductor film 3 for example in a 28-nanometer CMOS technological node, and is isolated from other components of the integrated circuit by isolating regions RIS for example comprising shallow trench isolations (STIs) extended by deep trench isolations (DTIs).

The transistor T1 comprises a first gate region RG1 insulated from the semiconductor film 3 by a first gate-dielectric region OX1 here comprising a layer of a dielectric material of high relative dielectric constant K, typically higher than 15. By way of indication, the thickness of the layer OX1 is about 4 nanometers.

The gate region RG1 is flanked by insulating lateral regions ESP1, commonly referred to as "spacers" in the art.

The transistor T1 also comprises source S and drain D regions comprising raised portions generally obtained by epitaxy.

In a second zone Z2 of the integrated circuit IC is located a second MOS transistor T2 produced in and on the carrier substrate 1.

More precisely, the transistor T2 comprises a second gate region RG2 insulated from the carrier substrate 1 by a second gate-dielectric region here comprising the dielectric layer OX1 and a portion 200 of the buried insulating layer 2. Thus, the thickness of the second gate-dielectric region of the transistor T2 is larger than the thickness of the first region of the gate dielectric OX1 of the transistor T1.

Typically, to produce a transistor capable of withstanding voltages of 3 to 5 volts, the overall thickness of the second gate-dielectric region is about 8 nanometers with a thickness of the layer 200 of about 4 nanometers.

Conventionally, the second transistor T2 also comprises spacers ESP2 produced on the flanks of the gate region RG2 and source S and drain D regions implanted in the carrier substrate 1.

The residual portion of the buried insulating layer 2 of the FDSOI substrate thus allows, very simply and without consuming the semiconductor film 3, a transistor T2 having a thick gate-dielectric region to be produced.

Figure 2:
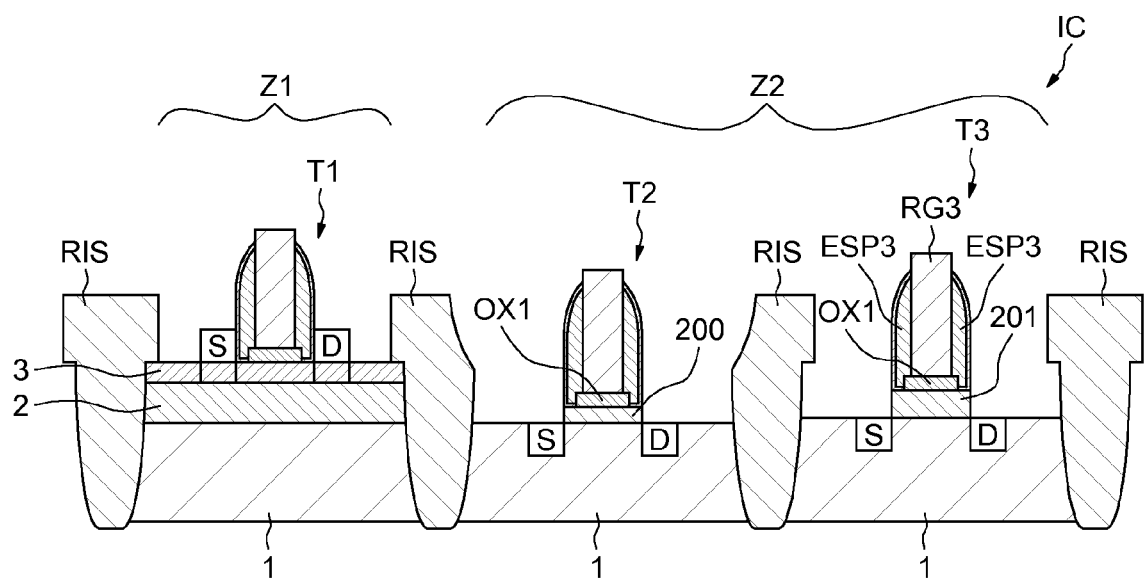

Moreover, it is also possible, as illustrated in FIG. 2, to produce, on the zone Z2, a plurality of transistors T2, T3 having gate-dielectric regions of different thicknesses, typically obtained with residual portions of the buried insulating layer having different thicknesses.

Thus, as illustrated in FIG. 2, the transistor T3 has a gate-dielectric region comprising a buried-insulating-layer portion 201 having a larger thickness than the portion 200 of the gate-dielectric region of the transistor T2.

Reference is now more precisely made to FIGS. 3 to 7 in order to illustrate one method of implementation of a process according to the invention.

Figure 3:
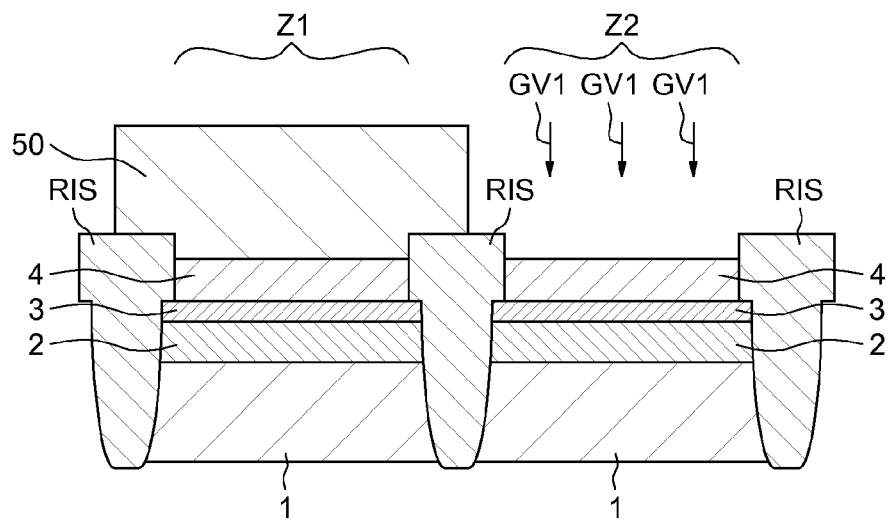

In FIG. 3, the process starts with a silicon-on-insulator substrate comprising the semiconductor film 3 supported by the buried insulating layer 2 (BOX) itself supported by the carrier substrate 1.

The zones Z1 and Z2 of the integrated circuit have here been bounded, in a conventional way known per se, by isolating regions RIS.

Moreover, as is conventionally the case, the semiconductor film 3 is covered with a passivation layer 4, commonly referred to as a "PADOX" in the art, that is intended to protect the surface of the semiconductor film 3 during prior operations, for example the well implantations.

Next, the first zone Z1 is protected with a resist mask 50, then etching GV1 is carried out in the zone Z2 of the integrated circuit so as to remove the subjacent passivation layer 4 and the semiconductor film 3 located in the zone Z2 while leaving behind a residual portion 20 of the buried insulating layer 2 (whose thickness is, in embodiments, less than the thickness of the BOX 2 for example in zone Z1).

Figure 4:
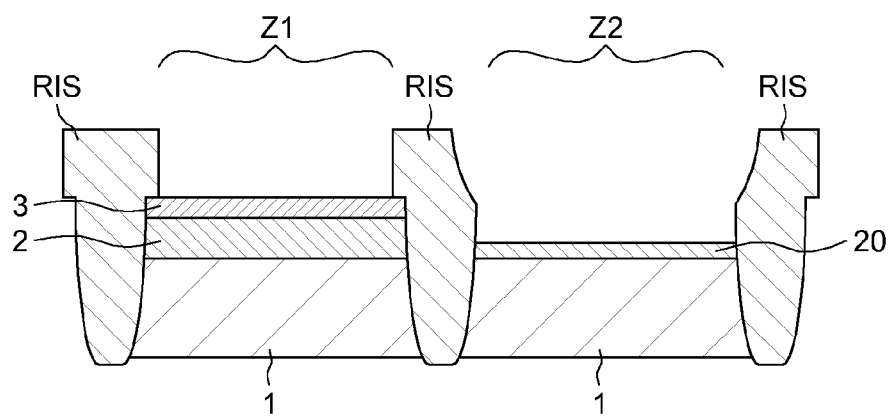

After the mask 50 and the passivation layer 4 located in the zone Z1 have been removed, the structure illustrated in FIG. 4 is obtained.

Figure 5:
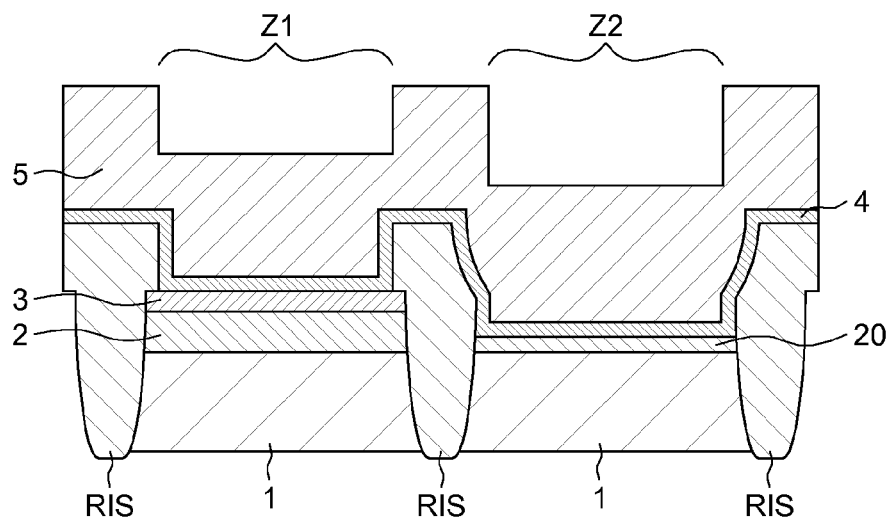

Next, in a conventional way known per se, at least one layer 4 of a gate-dielectric material, for example a material of high relative dielectric constant, is deposited and then a layer 5 of gate material, for example polysilicon and/or a metal, is deposited, without these examples being limiting (FIG. 5).

Next, as illustrated in FIG. 6, the gate regions RG1 and RG2 and the gate dielectric OX1 are patterned using a conventional etch GV2 known per se to define gate stacks.

Next, the insulating lateral regions ESP1 and ESP2 are formed in a conventional way known per se on each side of the gate stacks and, using an etch GV3, that part of the residual portion 20 of the buried insulating layer which is located exterior to the spacers ESP2 is removed, so as to form the buried-insulating-layer portion 200.

As regards the production of the source and drain regions of the transistor of the zone Z2, a plurality of variants are possible.

According to a first variant, the source and drain regions are produced by epitaxy simultaneously to the production of the raised source and drain regions of the transistor of the zone Z1, this then meaning that the source and drain regions of the transistor of the zone Z2 are also raised.

This being so, especially when the transistor of the zone Z2 is a high-voltage transistor, the presence of raised source and drain regions is not in most cases desirable because of the risk of breakdown of the insulating spacer ESP2 between the gate region and these raised source and drain regions, which risks limiting the voltage withstand of the device.

Thus, according to a second variant, the raised source and drain regions of the transistor of the zone Z1 are produced by epitaxy before said residual portion part 20 of the buried insulating layer has been etched. Specifically, this residual buried-insulating-layer portion, which then covers the entirety of the carrier substrate in the zone Z2, blocks the growth of source and drain regions in the zone Z2.

Next, once the raised source and drain regions have been formed in the zone Z1, that part of the residual portion 20 of the buried insulating layer which is located exterior to the spacers ESP2 is removed using the etch GV3 so as to form the buried-insulating-layer portion 200, and then source and drain regions are implanted in the carrier substrate 1.

It is also possible, as a variant, to implant source and drain regions through that part of the residual portion 20 of the buried insulating layer which is located exterior to the spacers ESP2 by adjustment of the implantation energy. Thus, it is not absolutely necessary to etch GV3 these source and drain regions before the implantation.

The invention is not limited to the methods of implementation and embodiments that have just been described but encompasses any variant thereof.

Thus, as illustrated in FIG. 8, it is possible to produce in the zone Z2 of the integrated circuit, a transistor T4 comprising a floating gate, such as those used in non-volatile memory cell such as FLASH or EEPROM cells.

More precisely, as illustrated in FIG. 8, the transistor T4 of the memory cell comprises a floating gate FG separated from the carrier substrate 1 by a first gate oxide 204 that is a residual portion of the buried insulating layer 2.

The transistor T4 moreover comprises a control gate CG separated from the floating gate FG by a dielectric region RD1, for example an oxide-nitride-oxide multilayer.

The two gates and the dielectric regions RD1 and 204 are flanked by lateral spacers ESP4.

The use of a residual layer of buried insulating layer obtained by etching makes it possible to adjust, precisely and very simply, without running the risk of consuming the semiconductor film 3, the thickness of the gate oxide 204, so as for example to obtain a thickness of about 12 nanometers, well suited to erasure using the Fowler Nordheim effect.

The invention claimed is:

1. An integrated circuit, comprising:
    a substrate of the silicon-on-insulator type comprising a semiconductor film on a buried insulating layer on a carrier substrate;
    a first zone of said substrate bounded on opposite sides by a first trench isolation and a second trench isolation;
    a second zone of said carrier substrate bounded on opposite sides by a third trench isolation and a fourth trench isolation and including a portion of said buried insulating layer but wherein no portion of said semiconductor film of said substrate is present in the second zone between the third trench isolation and the fourth trench isolation;
    a first transistor in said second zone comprising a first gate-dielectric region resting directly on the carrier substrate and formed by said portion of said buried insulating layer, wherein said buried insulating layer is not present in the second zone between a first edge of said portion forming said first gate-dielectric region and an edge of the third trench isolation and wherein said buried insulating layer is not present in the second zone between a second edge of said portion forming said first gate-dielectric region and an edge of the fourth trench isolation and without any presence of the semiconductor film on the first gate-dielectric region.

2. The integrated circuit according to claim 1, further comprising a second transistor in said first zone comprising a second gate-dielectric region resting on said semiconductor film, said second gate-dielectric region being thinner than the first gate-dielectric region.

3. The integrated circuit according to claim 2, wherein the second gate-dielectric region is formed by at least one layer of a first dielectric material and wherein the first transistor further comprises said at least one layer of the first dielectric located on said portion of the buried insulating layer.

4. The integrated circuit according to claim 1, wherein a thickness of said portion of the buried insulating layer in the second zone is thinner than a thickness of the buried insulating layer of the silicon-on-insulator type substrate in the first zone.

5. The integrated circuit according to claim 1, wherein said first transistor located in said second zone is a double-gate transistor comprising:
    a floating-gate first region separated from the carrier substrate by said portion of said buried insulating layer; and
    a control-gate second region separated from the floating-gate first region by a gate-dielectric region.

* * * * *